United States Patent
Dong et al.

(10) Patent No.: US 6,900,096 B2
(45) Date of Patent: May 31, 2005

(54) METHOD OF MANUFACTURING A FLASH MEMORY CELL

(75) Inventors: Cha Deok Dong, Ichon-Shi (KR); Sang Wook Park, Seoul (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 25 days.

(21) Appl. No.: 10/285,590

(22) Filed: Nov. 1, 2002

(65) Prior Publication Data

US 2003/0119255 A1 Jun. 26, 2003

(30) Foreign Application Priority Data

Dec. 22, 2001 (KR) .......................................... 2001-83492

(51) Int. Cl.$^7$ ............................................. H01L 21/336
(52) U.S. Cl. ..................................... 438/257; 438/775
(58) Field of Search ................................. 438/257, 249, 438/392, 263–267, 594, 595, 680, 682, 775, 914, 954

(56) References Cited

U.S. PATENT DOCUMENTS

| | | | |
|---|---|---|---|
| 5,631,179 A | * | 5/1997 | Sung et al. .................. 438/264 |
| 5,814,862 A | * | 9/1998 | Sung et al. .................. 257/344 |
| 6,054,733 A | * | 4/2000 | Doan et al. .................. 257/315 |
| 6,396,099 B2 | * | 5/2002 | Joo et al. ..................... 257/315 |
| 6,529,410 B1 | * | 3/2003 | Han et al. ............... 365/185.17 |

* cited by examiner

Primary Examiner—David Nhu
(74) Attorney, Agent, or Firm—Mayer, Brown, Rowe & Maw LLP

(57) ABSTRACT

The present invention relates to a method of manufacturing a flash memory cell capable of preventing an oxidation of a dielectric film between a floating gate and a control gate, in a manner that a polysilicon film for floating gate is deposited, nitrogen ions are injected to make amorphous and contaminate the surface of the polysilicon film.

15 Claims, 2 Drawing Sheets

METHOD OF MANUFACTURING A FLASH MEMORY CELL

BACKGROUND OF THE INVENTION

1. Field of the Invention

The invention relates to a method of manufacturing a flash memory cell. More particularly, the present invention relates to a method of manufacturing a flash memory cell capable of preventing an oxidation of a dielectric film between a floating gate and a control gate.

2. Description of the Prior Art

A flash memory cell includes a gate electrode of a stack structure in which a tunnel oxide film, a floating gate, a dielectric film and a control gate are stacked on a given region over a semiconductor substrate, and a junction region on a given region over the semiconductor substrate. A process of manufacturing the flash memory cell will be described below.

The tunnel oxide film and a first polysilicon film are formed on the semiconductor substrate. The first polysilicon film and the tunnel oxide film are then patterned by means of photolithography process and etch process using a given mask. A dielectric film, a second polysilicon film, a tungsten silicide film and a nitride film are formed on the entire structure. The nitride film, the tungsten silicide film, the second polysilicon film and the dielectric film are patterned by means of photolithography process and etch process using a given mask. At this time, the dielectric film has a lower oxide film, a nitride film and an upper oxide film stacked on it. Thereafter, an exposed portion of the first polysilicon film and an exposed portion of the tunnel oxide film are patterned by the self-aligned etch process using the nitride film as an etch mask. Therefore, a gate electrode of a stack structure is formed on the semiconductor substrate. Thereafter, source and drain junction regions are formed in the semiconductor substrate by implanting a low-concentration impurity-ion, forming spacers on sidewalls of the stack gate electrode and implanting a high-concentration impurity-ion.

In the flash memory cell manufactured by the above process, the annealing process is performed to compensate for etch damage caused during the etch process for forming the stack gate and to activate the impurity-ions. When the annealing process is performed, however, the lower and the upper oxide films of the dielectric film are oxidized, thus causing a smiling phenomenon by which the thickness of the dielectric film is increased. As the thickness of the dielectric film is increased, the capacitance is degraded when a gate bias is applied. Thus, there is a problem that the gate-coupling ratio becomes small and the erase speed is accordingly lowered to degrade the characteristic of the device.

SUMMARY OF THE INVENTION

The present invention is contrived to solve the above problems and an object of the present invention is to provide a method of manufacturing a flash memory cell capable of preventing an increase in the thickness of a dielectric film in the annealing process for compensating etch damages after an etch process for forming a stack gate.

Another object of the present invention is to provide a method of manufacturing a flash memory cell capable of increasing the program/erase speed by increasing the gate-coupling ratio.

In order to accomplish the above object, a method of manufacturing a flash memory cell comprises the steps of sequentially forming a tunnel oxide film and a first polysilicon film on a semiconductor substrate; nitrifying the surface of the first polysilicon film by performing a nitrogen ion implantation process; patterning given regions of the first polysilicon film and the tunnel oxide film; sequentially forming and then patterning a dielectric film, a second polysilicon film, a tungsten silicide film and a nitride film on the entire structure and patterning to form a stack gate on which a floating gate and a control gate are stacked; and forming source and drain junction regions in the semiconductor substrate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
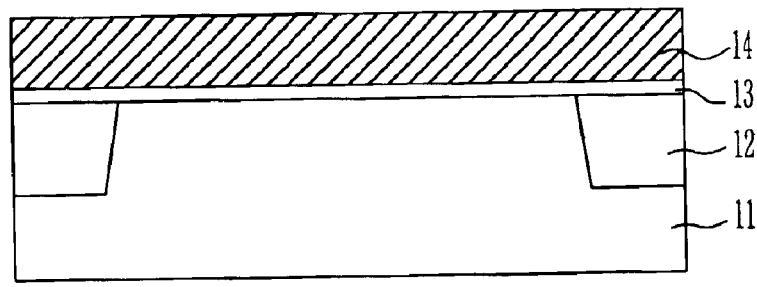
FIG. 1A to FIG. 1D are cross-sectional views of a flash memory cell for explaining a method of the flash memory cell according to the present invention.

The present invention will be described in detail by way of a preferred embodiment with reference to accompanying drawings, in which like reference numerals are used to identify the same or similar parts.

FIG. 1A to FIG. 1D are cross-sectional views of a flash memory cell for explaining a method of the flash memory cell according to the present invention.

Referring now to FIG. 1A, a trench of a shallow depth is first formed at a given region of the semiconductor substrate 11 and then an insulating film is buried to form a device isolation film 12. Next, a tunnel oxide film 13 and a first polysilicon film 14 are sequentially formed on the entire structure. In the above, the cleaning process is performed before the tunnel oxide film 12 is formed. The cleaning process may be performed using a solution in which a HF diluted to the ratio of 50:1 and a SC-1 ($NH_4OH/H_2O_2/H_2O$) are compounded or a solution in which a BOE mixed to the ratio of 100:1 or 300:1 and a SC-1 ($NH_4OH/H_2O_2/H_2O$) are compounded. The tunnel oxide film 13 is formed by means of a wet oxidation process in order to minimize the interface defect intensity with the semiconductor substrate 11. The wet oxidation process includes performing an oxidation process at the temperature of 750~800° C. and then performing the annealing process using nitrogen at the temperature of 900~910° C. for about 20~30 minutes. The first polysilicon film 14 is formed by means of LPCVD method using $SiH_4$ gas and $PH_3$ gas at the temperature of 560~620° C. under the pressure of 0.1~3 Torr in order to minimize a grain size of the first polysilicon 14. At this time, the first polysilicon film 14 has a doped phosphorous concentration of 1.5E20~3E20 atoms/cc.

Figure 1B:
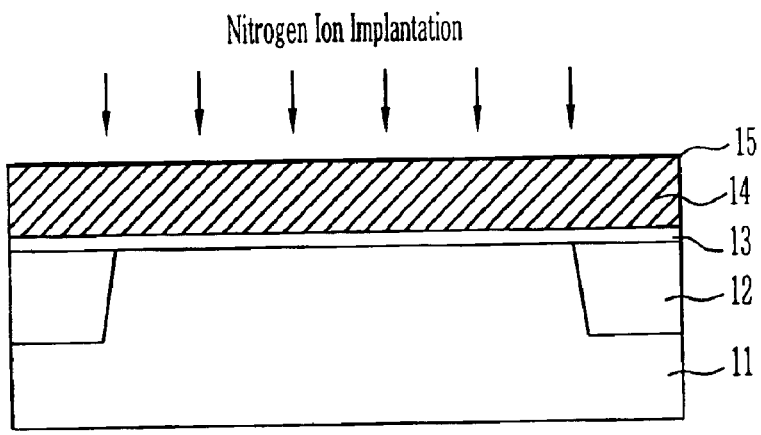

Referring now to FIG. 1B, a nitrogen ion is implanted in a surface of the first polysilicon film 14, thereby a nitrogen injection layer 15 of several thin A is formed an upper surface of the first polysilicon film 14 that becomes amorphous and contaminated. The nitrogen ion implantation process is performed using a low energy of 1~10 keV. At this time, the dose is about 5E14~5E15 ions/$cm^2$. Meanwhile, the nitrogen ion implantation process is performed to have a tilt angle of 0~45°.

Figure 1C:
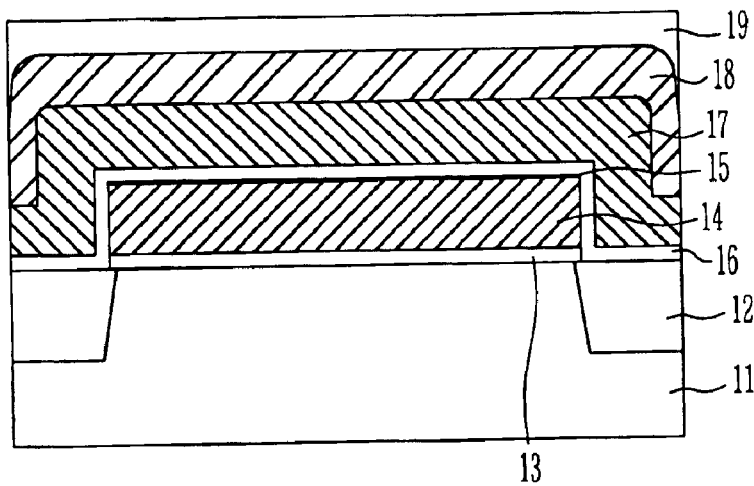

Referring now to FIG. 1C, the first polysilicon film 14 and the tunnel oxide film 13 are patterned by means of photolithography process and etch process. A cleaning process is performed to remove a native oxide film and particles. The cleaning process is performed using a solution in which a HF diluted to the ratio of 50:1 or 100:1 and a SC-1 (NH$_4$OH/H$_2$O$_2$/H$_2$O) are compounded. A dielectric film 16, a second polysilicon film 17, a tungsten silicide film 18 and a nitride film 19 are sequentially formed on the entire structure including the patterned first polysilicon film 14. The dielectric film 16 has a lower oxide film, a nitride film and an upper oxide film stacked on. The lower and upper oxide films are formed using DCS (SiH$_2$Cl$_2$) gas and N$_2$O gas. The nitride film is formed using DCS (SiH$_2$Cl$_2$) and NH$_3$ gas. The lower and upper oxide films are formed by loading a wafer into the reaction furnace having the temperature of 600~700° C., raising the temperature of the reaction furnace to 810~850° C. and then depositing the lower and upper oxide films at thickness of 35~60Å by means of LPCVD method with the pressure maintained 0.1~3 Torr. Further, the nitride film is deposited in thickness of 50~65Å by means of LPCVD method at the temperature of 650~800° C. and under the pressure of 0.1~3 Torr.

Meanwhile, after the dielectric film 16 is formed, a steam annealing is preformed at the temperature of 750~800° C. by means of wet oxidation method, in order to improve the quality of the dielectric film 16 and enhance the interface in respective layers. The steam annealing is performed under a condition which a bare silicon wafer used a monitoring wafer is oxidized 150~300Å in thickness. The process of forming the dielectric film 16 and the steam annealing prevent contamination due to the native oxide film or the impurities since the time among respective processes is progressed with no time delay. In order to prevent diffusion of fluorine that can increase the thickness of the oxide films of the dielectric film 16 when the tungsten silicide film 18 is deposited, the second polysilicon film 17 is formed to have a dual structure of a doped amorphous silicon film and an undoped amorphous silicon film. The doped and undoped amorphous silicon films are crystallized by a process of a high temperature after the tungsten silicide film 18 is formed. At this time, the doped amorphous silicon film and the undoped amorphous silicon film are deposited at the ratio of 1:2~6:1 in thickness, so that they have the total thickness of 500~1000Å. The doped amorphous silicon film and the undoped amorphous silicon film are deposited at the temperature of 510~550° C. under the pressure of 1~3 Torr. At this time, the doped amorphous silicon film and the undoped amorphous silicon film are formed by depositing the doped amorphous silicon film using a silicon source gas such as SiH$_4$ gas or Si$_2$H$_6$ gas and a doping gas such as PH$_3$ gas, and then depositing the undoped amorphous silicon film by stopping introduction of PH$_3$ gas. The tungsten silicide film 18 is formed to have an adequate step coverage using SiH$_4$ gas and WF$_6$ gas or DCS (SiH$_2$Cl$_2$) gas and WF$_6$ gas at the temperature of 300~500° C. The tungsten silicide film 18 is grown to have stoichiometry of about 2.0~2.8 in order to minimize the sheet resistance.

Figure 1D:
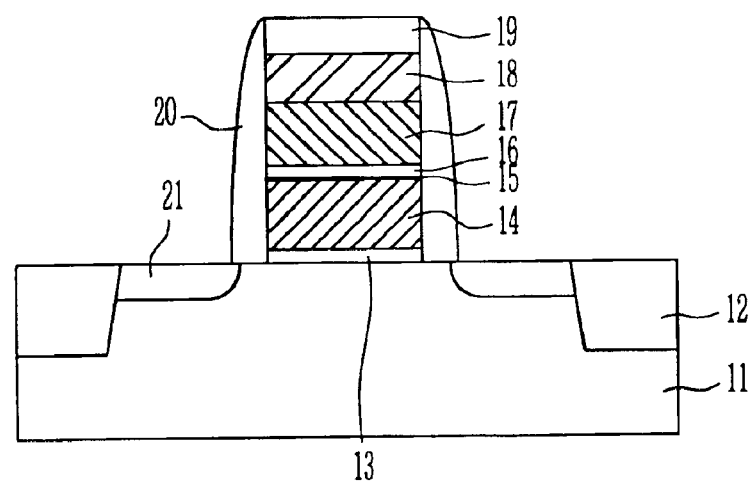

Referring now to FIG. 1D, the nitride film 19, the tungsten silicide film 18, the second polysilicon film 17 and the dielectric film 16 are patterned by means of photolithography process and etch process. Next, the first polysilicon film 14 and the tunnel oxide film 13 are patterned by means of the self-aligned etch process using the nitride film 19 as a mask, thereby a gate electrode of a stack structure is formed on the semiconductor substrate. Then, after a low concentration impurity-ion implantation process is performed, a re-oxidation process for compensating for etch damage of the sidewall of the stack gate and activating the impurity-ion. After spacers 20 are formed at the sidewalls of the stack gate, a high concentration impurity-ion implantation process is performed to form source and drain junction regions 21 in the semiconductor substrate 11.

As above, the nitrogen ion implantation process is performed to form the thin nitrogen injection layer 15 on the surface of the first polysilicon film 14, therefore the thickness of the oxide films within the dielectric film 16 does not increase in the annealing process for compensating etch damage after the etch process for forming the stack gate is performed, so that the gate coupling ration between the floating gate and the control gate is increased.

For example, if nitrogen ion is injected at the dose amount of 3.0E15 ions/cm$^2$ in the energy of 3 KeV after the first polysilicon film 14 is deposited 600Å in thickness, the gate coupling ratio of a 0.35/0.2Ö cell and a 0.3/0.2 Ö cell are 0.59 and 0.63, respectively, which is higher 0.04~0.05 than the gate coupling ratio of 0.55 and 0.58, respectively, when a nitrogen ion is not injected. At this time, the oxidation process for compensating the etch damage of the stack gate and the oxidation process for activating an impurity-ion are performed so that the oxide films can be grown to be 50Å and 100Å in thickness, respectively.

As mentioned above, according to the present invention, after a polysilicon film for a floating gate is deposited, a nitrogen ion is injected to make amorphous and contaminate the surface of the polysilicon film. Due to this, an oxidation of a dielectric film is prevented in the annealing process performed after the etch process, so that the gate coupling ratio between the floating gate and the control gate is increased. Therefore, the present invention has advantages that the program/erase speed is improved and the operating speed of the device is improved. With this advantage, the present invention is inevitable in implementing a cell of a high-integrated flash memory device of over 0.25 Ö class. Further, the present invention has an advantage that the characteristic of the device and the throughput can be improved by adding only a single process using existing ion implantation equipment and process without additional complex process and apparatuses.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory cell, comprising the steps of:

sequentially forming a tunnel oxide film and a first polysilicon film on a semiconductor substrate;

performing a nitrogen ion implantation process to nitrify a surface of said first polysilicon film;

patterning given regions of the first polysilicon film and the tunnel oxide film;

sequentially forming and then patterning a dielectric film, a second polysilicon film, a tungsten silicide film and a nitride film on an entire structure including the first polysilicon film and patterning to form a stack gate on which a floating gate and a control gate are stacked; and forming source and drain junction regions in the semiconductor substrate.

2. The method as claimed in claim 1, wherein said first polysilicon film is formed by LPCVD method using $SiH_4$ gas and $PH_3$ gas at a temperature of about 560~620° C. under a pressure of 0.1~0.3 Torr.

3. The method as claimed in claim 1, wherein said first polysilicon film has a doped phosphorous concentration of 1.5E20~3E20 atoms/cc.

4. The method as claimed in claim 1, wherein said nitrogen ion implantation process is performed at a dose amount of 5E14~5E15 ions/cm$^2$ at an energy of 1~10 keV.

5. The method as claimed in claim 1, wherein said nitrogen ion implantation process is performed to have a tilt angle of 0~45°.

6. The method as claimed in claim 1, wherein said dielectric film is formed by stacking a lower oxide film, a nitride film and an upper oxide film.

7. The method as claimed in claim 6, wherein said lower oxide film is deposited in thickness of 35~60 Å by LPCVD method using $DCS(SiH_2Cl_2)$ and $N_2O$ gas under a pressure of 0.1~3 Torr at a temperature of 810~850° C.

8. The method as claimed in claim 6, wherein said nitride film is deposited in thickness of 50~65 Å by LPCVD method using $DCS(SiH_2Cl_2)$ and $NH_3$ gas under a pressure of 0.1~3 Torr at a temperature of 650~800° C.

9. The method as claimed in claim 6, wherein said upper oxide film is deposited in thickness of 35~60° C. by LPCVD method using $DCS(SiH_2Cl_2)$ and $N_2O$ gas under the pressure of 0.1~3 Torr at the temperature of 810~850° C.

10. The method as claimed in claim 1, wherein, after the dielectric film is formed, a steam anneal is performed at a temperature of 750~800° C.

11. The method as claimed in claim 10, wherein said steam anneal is performed under a condition in which a bare silicon wafer is oxidized to be 150~300 Å in thickness.

12. The method as claimed in claim 1, wherein said second polysilicon film has a dual structure having a doped amorphous silicon film and an undoped amorphous silicon film.

13. The method as claimed in claim 12, wherein said doped amorphous silicon film and said undoped amorphous silicon film are deposited at a ratio of 1:2~6:1 in thickness.

14. The method as claimed in claim 12, wherein said doped amorphous silicon film is formed using $SiH_4$ gas or $Si_2H_6$ gas and $PH_3$ under a pressure of 0.1~3 Torr at a temperature of 510~550° C. and said undoped amorphous silicon film is consecutively formed by stopping introduction of the $PH_3$ in the above condition.

15. The method as claimed in claim 1, wherein said tungsten silicide film is formed to have stoichiometry of 2.0~2.8 using $SiH_4$ gas and $WF_6$ gas or $DCS (SiH_2Cl_2)$ gas and $WF_6$ gas at a temperature of 300~500° C.

* * * * *